United States Patent
Gu et al.

(10) Patent No.: US 9,505,651 B2
(45) Date of Patent: Nov. 29, 2016

(54) SYSTEMS AND METHODS FOR ACID-TREATING GLASS ARTICLES

(71) Applicant: CORNING INCORPORATED, Corning, NY (US)

(72) Inventors: Yunfeng Gu, Painted Post, NY (US); Jun Hou, Painted Post, NY (US); Aize Li, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 14/400,919

(22) PCT Filed: May 29, 2013

(86) PCT No.: PCT/US2013/043048
§ 371 (c)(1),
(2) Date: Nov. 13, 2014

(87) PCT Pub. No.: WO2013/181213
PCT Pub. Date: Dec. 5, 2013

(65) Prior Publication Data
US 2015/0122779 A1 May 7, 2015

Related U.S. Application Data

(60) Provisional application No. 61/653,546, filed on May 31, 2012.

(51) Int. Cl.
| | |
|---|---|
| *C03C 15/02* | (2006.01) |
| *B05C 3/02* | (2006.01) |
| *C03C 15/00* | (2006.01) |
| *C23F 1/46* | (2006.01) |
| *B08B 3/14* | (2006.01) |
| *H01L 21/67* | (2006.01) |
| *B05C 5/00* | (2006.01) |

(52) U.S. Cl.
CPC .............. *C03C 15/02* (2013.01); *B05C 3/02* (2013.01); *C03C 15/00* (2013.01); *B05C 5/00* (2013.01); *B08B 3/14* (2013.01); *C23F 1/46* (2013.01); *H01L 21/6708* (2013.01); *H01L 21/67086* (2013.01)

(58) Field of Classification Search
None
See application file for complete search history.

(56) References Cited

U.S. PATENT DOCUMENTS

| | | | |
|---|---|---|---|
| 4,125,594 A | 11/1978 | Su et al. | |
| 4,332,649 A | 6/1982 | Salzle | |
| 4,555,304 A | 11/1985 | Sälzle | |
| 5,049,233 A * | 9/1991 | Davis | C01D 1/38 156/345.18 |
| 5,255,797 A * | 10/1993 | Kos | H01L 21/67373 206/454 |
| 5,279,705 A * | 1/1994 | Tanaka | H01L 21/31116 257/E21.252 |
| 5,429,251 A * | 7/1995 | Matthews | H01L 21/67313 211/41.18 |
| 5,846,374 A * | 12/1998 | Parab | H01L 21/67086 156/345.11 |
| 8,765,000 B2 * | 7/2014 | Palsulich | H01L 21/67086 216/94 |
| 2005/0224462 A1* | 10/2005 | Doh | C03C 15/00 216/97 |
| 2007/0138600 A1* | 6/2007 | Hartlep | H01L 21/67028 257/626 |
| 2008/0044956 A1* | 2/2008 | Takechi | C03C 15/00 438/149 |
| 2014/0339194 A1 | 11/2014 | Gu et al. | |
| 2015/0136736 A1* | 5/2015 | Jin | C09K 13/08 216/97 |

FOREIGN PATENT DOCUMENTS

| | | | |
|---|---|---|---|
| DE | 1 920 009 A1 | 10/1970 | |
| EP | 0547512 A1 * | 6/1993 | .......... B01D 9/0036 |
| GB | 829605 | 3/1960 | |
| JP | 2009-196858 A | 9/2009 | |
| KR | 943321 | 9/2009 | |

OTHER PUBLICATIONS

K. Martinek; International Search Report and Written Opinion issued in PCT/US2013/043048; mailed Nov. 11, 2013; 8 pages; European Patent Office.

* cited by examiner

*Primary Examiner* — Anita Alanko
(74) *Attorney, Agent, or Firm* — Timothy M. Schaeberle (57) ABSTRACT

Described herein are various systems and methods for using acidic media to enhance the surface characteristics of glass articles while reducing the adverse effects of precipitate/sludge formation. The systems and methods generally implement a precipitation-capturing device that is configured to 1) permit formation of sludge thereon and 2) reduce formation of the sludge on other solid surfaces involved in the systems and methods.

18 Claims, 6 Drawing Sheets

SYSTEMS AND METHODS FOR ACID-TREATING GLASS ARTICLES

CROSS-REFERENCE TO RELATED APPLICATIONS

This application claims the benefit of priority under 35 U.S.C. §119 of U.S. Provisional Application Ser. No. 61/653,546 filed on May 31, 2012 the contents of which are relied upon and incorporated herein by reference in their entirety as if fully set forth below.

TECHNICAL FIELD

The present disclosure relates generally to the polishing and strengthening of glass. More particularly, the various embodiments described herein relate to systems and methods for using acidic media to enhance the surface characteristics of glass articles.

BACKGROUND

The wet chemical etching of silicate glasses with, for example, aqueous hydrofluoric acid-containing media to polish the surfaces of the glasses or to strengthen the glasses via the removal of surface flaws is known. HF-containing media are capable of dissolving silica and other constituents of silicate glasses, although precipitates of those constituents, commonly referred to as "sludge," are generally produced as by-products of that dissolution. Depending upon the compositions of the media and the glasses being treated, compounds such as sulfates, bisulfates, fluorides and silico fluorides of the cationic constituents of the glasses can be precipitated.

These precipitates can be deposited on the surfaces of glasses being treated to form firmly adherent layers that can progressively reduce the etching rate. In addition, precipitate buildup on processing tools (e.g., squeegee rollers, acid bath cooling coils, and the like) can cause equipment malfunctions and/or damage to the glass surfaces being treated. The resulting need to clean tooling and/or the surfaces of glass articles being treated eventually requires that the etching processes be interrupted or terminated, with substantial decreases in production rates and increases in labor costs.

A number of measures to address the problem of sludge buildup in glass etching media have been proposed. In one approach, concentrations of sodium and/or potassium ions in the etching bath resulting from the dissolution of glass constituents are continuously reduced. The desired reductions may be achieved through one or a combination of measures including: (i) adding fluorosilicic acid to the bath; (ii) precipitating silicofluorides of the alkali ions and filtering off the precipitates; (iii) mercury cell electrolysis of the bath to form sodium and/or potassium amalgams, (iv) bath electrolysis in a cell having a cation semi-permeable membrane; and (v) utilizing alkali metal ion exchangers. An alternative ion-exchange approach involves treating the etching solution with a weak anion exchange resin of the polyamine type to remove $SiF_6^-$ ions, thereby reducing the sludge-forming capacity of the solution.

Mechanical approaches for controlling sludge buildup include the use of a supplemental buffer tank for carrying out a filtration of precipitates from etching solution circulated from the main etching tank. In a variation on the approach of maintaining an effective HF concentration in the bath, fluoride gas generated during the etching process is collected and condensed to produce supplemental HF for recycling back into the etchant tank. Alternatively, it has been proposed to neutralize at least a portion of the hydrofluosilicic acid generated during etching while concurrently adding sufficient hydrofluoric acid to the bath to maintain the initial concentration of free hydrofluoric acid therein. Hydrofluorosilicic acid neutralization is achieved through the addition to the bath of a soluble potassium salt such as potassium carbonate, precipitating an insoluble potassium silicofluoride (within the bath), which can then be efficiently removed by filtration.

As is apparent from the foregoing, however, most of the proposed solutions to the problem of sludge buildup involve the design and construction of supplemental systems that are often quite costly and that may not be practical where operating spaces are limited. In addition, new chemicals can be required that are expensive, or that have the potential for changing bath chemistry in ways that may adversely affect etching efficiencies or lead to the formation of new, possibly undesirable, by-products.

There accordingly remains a need for improved technologies for addressing the problem of sludge in an efficient and economical manner. It is to the provision of such technologies that the present disclosure is directed.

BRIEF SUMMARY

In accordance with the present disclosure, the problem of sludge accumulation in acidic etching media is at least partially addressed through the use of a precipitation-capturing device that is acid-resistant and is thermally stable. The use of such a device permits, and can even facilitate, nucleation and crystallization of precipitates of constituent components of the glass articles that are dissolved in the acidic etching medium such that the amount of sludge formed on the surfaces of any solid (other than the precipitation-capturing device) that is in fluid communication with the acidic etching medium is reduced or even eliminated.

One type of system for treating a glass article includes an etching vessel, an acidic medium disposed in the etching vessel, and a precipitation-capturing device that is both disposed in the etching vessel and in fluid communication with the acidic medium. The precipitation-capturing device can be formed from a material that is insoluble in the acidic medium and that is thermally stable to at least 60 degrees Celsius (° C.). The precipitation-capturing device is configured to permit formation thereon of precipitates of constituent components of the glass article that are dissolved in the acidic medium (also referred to herein as "sludge"). In addition, the precipitation-capturing device is configured to reduce formation of the precipitates on a surface of the etching vessel, the glass article, and any other solid article disposed in the etching vessel relative to an identical system for treating the glass article that lacks the precipitation-capturing device.

The acidic medium can include one or more of HF, $H_2SO_4$, $H_2SO_3$, $H_3PO_4$, $H_3PO_2$, $HNO_3$, HCl, HBr, HOAc (acetic acid), citric acid, tartaric acid, ascorbic acid, ethylenediaminetetraacetic acid (EDTA), methanesulfonic acid, or toluenesulfonic acid. In some cases, the acidic medium comprises HF and one or more of HCL, $HNO_3$ or $H_2SO_4$.

In some implementations of this type of system, the precipitation-capturing device can be formed from polyvinyl chloride, polytetrafluoroethylene, polyvinylidene fluoride, polypropylene, natural rubber, synthetic nitrile butadiene rubber, graphitic carbon, a fluoropolymer elastomer, hexafluoropropylene, or perfluoromethylvinylether.

Depending on the implementation, the precipitation-capturing device can have a porous and/or roughened surface. In addition, or alternatively, the precipitation-capturing device can be seeded with a first plurality of precipitates of constituent components of the glass article to increase and/or expedite formation of additional precipitates of constituent components of the glass article during operation of the system.

In certain cases, the precipitation-capturing device can also be at least partially submerged in the acidic medium.

This type of system can also include a temperature-increasing mechanism that is configured to elevate a temperature of the acidic medium, the glass article, the precipitation-capturing device, and/or the etching vessel. For example, the temperature of the acidic medium can be elevated to about 40 degrees Celsius to about 60 degrees Celsius.

One type of method for treating a glass article includes providing a system for treating the glass article, and contacting the glass article with an acidic medium for a time effective to dissolve at least a portion of the glass article. The provided system includes an etching vessel, the acidic medium, which is disposed in the etching vessel, and a precipitation-capturing device that is disposed in the etching vessel and that is in fluid communication with the acidic medium. The precipitation-capturing device can be formed from a material that is not soluble in the acidic medium and that is thermally stable to at least 60° C. The precipitation-capturing device is configured to permit formation thereon of precipitates of constituent components of the glass article that are dissolved in the acidic medium. In addition, the precipitation-capturing device is configured to reduce formation of the precipitates on a surface of the etching vessel, the glass article, and any other solid article disposed in the etching vessel relative to an identical system for treating the glass article that lacks the precipitation-capturing device.

The portion of the glass article that is dissolved can be less than about 10 micrometers of a surface layer of the glass article.

In certain implementations of this type of method, the contacting can entail submerging at least a portion of the glass article in the acidic medium. Alternatively, the contacting can involve spraying the acidic medium on at least a portion of the glass article in the etching vessel.

The method can further involve a step of elevating a temperature of the acidic medium, the glass article, the precipitation-capturing device, and/or the etching vessel. For example, in certain cases, the temperature of the acidic medium can be about 40 degrees Celsius to about 60 degrees Celsius.

The method can also involve seeding the precipitation-capturing device with a plurality of precipitates of constituent components of the glass article prior to contacting the glass article with the acidic medium. This seeding step can entail contacting a surface of the precipitation-capturing device with a seeding solution so as to wet the surface with the seeding solution, followed by drying the wetted seeding solution on the surface of the precipitation-capturing device. The seeding solution in this case includes dissolved glass article constituent components.

The method can also include a step of removing the precipitation-capturing device from the etching vessel after the precipitation-capturing device is saturated with the precipitates of constituent components of the glass article. If desired, the saturated precipitation-capturing device can be cleaned so as to remove at least a portion of the precipitates of constituent components of the glass article therefrom.

Next, the cleaned precipitation-capturing device can be inserted back into the etching vessel. In certain cases, prior to inserting the cleaned precipitation-capturing device back into the etching vessel, the cleaned precipitation-capturing device can be seeded with a plurality of precipitates of constituent components of the glass article.

It is to be understood that both the foregoing brief summary and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

These and other aspects, advantages, and salient features will become apparent from the following detailed description, the accompanying drawings, and the appended claims.

DETAILED DESCRIPTION

Referring now to the figures, wherein like reference numerals represent like parts throughout the several views, exemplary embodiments will be described in detail. Throughout this description, various components may be identified having specific values or parameters. These items, however, are provided as being exemplary of the present disclosure. Indeed, the exemplary embodiments do not limit the various aspects and concepts, as many comparable parameters, sizes, ranges, and/or values may be implemented. Similarly, the terms "first," "second," "primary," "secondary," "top," "bottom," "distal," "proximal," and the like, do not denote any order, quantity, or importance, but rather are used to distinguish one element from another. Further, the terms "a," "an," and "the" do not denote a limitation of quantity, but rather denote the presence of "at least one" of the referenced item.

Described herein are various systems and methods for using acidic media to enhance the surface characteristics of glass articles while reducing the adverse effects of precipitate/sludge formation.

The glass articles for use with the systems and methods described herein can be any of a variety of glasses known to those skilled in the art to which this disclosure pertains. For example, the glass articles can comprise a silicate glass, a borosilicate glass, an aluminosilicate glass, a boroaluminosilicate glass, or a similar glass. The glass articles can also include a ceramic phase, such that the article is a glass-ceramic article. In such cases, the ceramic phase can include β-spodumene, β-quartz, nepheline, kalsilite, carnegieite, or a similar ceramic material.

Optionally, such glass articles can be chemically (e.g., by ion exchange) or thermally strengthened prior to the acid etching treatment. The strengthened glass articles have strengthened surface layers extending from a first surface and a second surface to a depth of layer below each surface. The strengthened surface layers are under compressive stress, whereas a central region of the glass article is under tension, or tensile stress, so as to balance forces within the glass article.

The acid treatment of such glass articles serves to modify the geometry of glass surface flaws in a way that substantially reduces the tendency of strength-limiting flaws (i.e., flaws that readily propagate under applied stress) to cause failure of the glass article. At the same time, the acid treatment does not greatly reduce the sizes of the flaws or materially change the chemical, optical and physical characteristics of the glass surface. The result is an increase in glass article strength without significant material removal that can lead to changes in glass surface quality, overall article thickness, and/or, if applicable, strengthened surface compression levels. Despite the minimal material removal during acid treatment, a significant amount of sludge can be produced over time.

Thus, the systems for using acidic media to enhance the surface characteristics of glass articles while reducing the adverse effects of precipitate/sludge formation described herein generally include an etching vessel in which the glass articles are etched, an acidic etching medium that is disposed within the etching vessel, and the precipitation-capturing device that also is disposed within the etching vessel such that it is in fluid communication with the acidic medium.

The etching vessel can be any type of container that is capable of holding the acidic medium, the precipitation-capturing device, and the glass articles that are to be etched. There is no particular limitation on the size and shape of the etching vessel, or on the materials from which it is formed. In exemplary implementations, however, the etching vessel is acid-resistant. That is, it can be entirely insoluble in, and non-reactive with, any component of the acidic etching medium.

Acid etching media are well known to those skilled in the art to which this disclosure pertains. By way of example, such media can comprise any of HF, $H_2SO_4$, $H_2SO_3$, $H_3PO_4$, $H_3PO_2$, $HNO_3$, HCl, HBr, HOAc (acetic acid), citric acid, tartaric acid, ascorbic acid, ethylenediaminetetraacetic acid (EDTA), methanesulfonic acid, toluenesulfonic acid, or the like. The appropriate acidic medium will be chosen based on the composition of the glass articles to be treated. In exemplary implementations, the acid etching medium comprises HF and one or more of HCL, $HNO_3$ and $H_2SO_4$. As one particular example of such a medium, an aqueous acidic solution consisting of 5 volume percent (vol. %) HF (48%) and 5 vol. % $H_2SO_4$ (98%) in water can be used.

As stated above, the precipitation-capturing device is acid-resistant (i.e., insoluble in, and non-reactive with, any component of the acidic medium). Exemplary materials that can be used to form the precipitation-capturing device include polyvinyl chloride (PVC), polytetrafluoroethylene (PTFE) (e.g., those PTFE products sold under the TEFLON trademark), polyvinylidene fluoride (PVDF) (e.g., those PVDF products sold under the KYNAR trademark), polypropylene, natural rubber, synthetic nitrile butadiene rubber (NBR or Buna-N), graphitic carbon, fluoropolymer elastomers (e.g., those products sold under the VITON trademark), hexafluoropropylene (HFP), perfluoromethylvinylether (PMVE), and the like.

There is no particular limitation on the shape or form of the precipitation-capturing device. By way of example, the precipitation-capturing device can be a flat monolithic sheet, a solid rod, a cylinder (hollow tubule), an assembly of cylinders, a honeycomb-like solid, or the like. Ultimately, the precipitation-capturing device should have at least one surface in fluid communication with the acidic medium, wherein the at least one surface facilitates nucleation and/or crystal formation and growth of sludge. That is, when the precipitation-capturing device is in fluid communication with the acidic medium (which contains some amount of dissolved glass), it can continuously cause the precipitate or sludge to preferentially form on its surface. This preferential precipitation serves to both reduce the dissolved glass concentration in the acidic medium, and minimize or prevent precipitation or sludge formation elsewhere in the etching vessel (i.e., on a surface of the glass article being treated, on a surface of the etching vessel, or any other solid material other than the precipitation-capturing device within the etching vessel).

In order to maximize the effect of the precipitation-capturing device, the precipitation-capturing device can be porous or have a roughened surface to provide a higher surface area available for precipitation of dissolved glass constituents in the acidic medium. Alternatively, or in addition, the precipitation-capturing device can be "seeded" for better performance. That is, the precipitation-capturing device can have some dissolved constituent component of the glass articles being treated precipitated thereon before implementation in the system. The seeded sludge can serve to increase and/or expedite the formation of additional sludge on the precipitation-capturing device during implementation of the system.

While the precipitation-capturing device is disposed in fluid communication with the acidic medium, it can also be at least partially submerged in the acidic medium to provide a greater opportunity for the sludge to form on a surface of the precipitation-capturing device. In exemplary implementations of the systems described herein, the precipitation-capturing device is entirely submerged within the acidic medium.

In certain implementations, the systems will also include an optional temperature-increasing mechanism. That is, a heating source can be used to elevate the temperature of the acidic medium, the glass article, the precipitation-capturing device, and/or the etching vessel itself. In one such example, the acidic medium is directly heated to a temperature of about 40 to about 60° C. In such cases, the precipitation-capturing device will be thermally stable (i.e., it will not deform, react, or melt) at the temperatures to which it will be exposed.

Methods of using acidic media to enhance the surface characteristics of glass articles while reducing the adverse effects of precipitate/sludge formation generally involve disposing a glass article in the etching vessel of the systems described above, and contacting the glass article with the acidic medium for a time and at a temperature effective to dissolve a portion of the glass article. The contacting can be accomplished by submerging at least a portion of the glass article in the acidic medium, or by spraying the acidic medium on at least a portion of the glass article in the etching vessel.

In general, the acidic medium will react with the glass article to remove a thin surface layer thereof (e.g., less than about 10 micrometers (μm)), although thicker layers can be removed if desired. The contacting of the precipitation-capturing device with the acidic medium can generally last for a few minutes, but can be longer if thicker layers are desired to be removed. Ultimately, as described above, the effect of removing the surface layer will be that strength-limiting flaws are mitigated.

In certain implementations of the methods described herein, the temperature of the acidic medium, the glass article, the precipitation-capturing device, and/or the etching vessel itself can be elevated to facilitate or expedite the dissolution of the surface layer of the glass articles. For example, the acidic medium can be heated to a temperature of about 40 to about 60° C.

Prior to contacting the glass article with the acidic medium, the precipitation-capturing device can be seeded. The optional seeding step can include contacting the surface or surfaces of the precipitation-capturing device that will be in fluid communication with the acidic medium with an acidic seeding solution that contains dissolved glass constituent components effective to wet the surface or surfaces, followed by drying the wetted surface or surfaces. Once dried, the precipitation-capturing device will have seed crystals of the glass constituent components thereon. As described above, these seed crystals can serve to increase and/or expedite the formation of additional sludge on the precipitation-capturing device during implementation of the system.

After a given period of operation of the systems and methods described herein, the precipitation-capturing device can be saturated with sludge such that minimal additional precipitate is formed thereon. In such situations, the precipitation-capturing device can be removed from the etching vessel and replaced with another precipitation-capturing device. In certain other situations, the precipitation-capturing device can be removed from the etching vessel and cleaned so as to remove the sludge formed thereon. Once the sludge has been cleaned/removed from the precipitation-capturing device, it can be reused. That is, it can be reinserted into the etching vessel, or it can undergo the optional seeding step prior to being reinserted into the etching vessel.

As can be seen from the above description, the systems and methods of the present disclosure are able to reduce the adverse effects of precipitate/sludge formation in acidic etching media.

The various embodiments of the present disclosure are further illustrated by the following non-limiting examples.

EXAMPLES

Example 1

Precipitation Study Using Non-Seeded Surfaces

In this example, three types of precipitation-capturing devices were studied for efficacy. Each of these devices were insoluble in HF and $H_2SO_4$. The first device was a sheet of smooth, non-porous VITON. The second device was a sheet of the same material, with the exception that the surfaces of the sheet were mechanically roughened using sandpaper. The third device was a sheet of porous PTFE (having a porosity of about 49% with a median pore size of about 17.8 μm).

An acid solution containing 1.5 M HF, 0.9 M $H_2SO_4$, and 10 grams per liter (g/l) dissolved glass was prepared. This involved the formation of a glass melt having the composition shown in Table I so as to simulate an ion-exchanged alkali aluminosilicate glass. After cooling the glass melt, the bulk glass was ground into a powder that could pass through 100 mesh screens using yttrium-stabilized zirconia media. The acid mixture was prepared by mixing 14.0 milliliters (ml) concentrated HF (29 M) and 8.9 ml concentrated $H_2SO_4$ (18 M) with 154.2 ml deionized water. 1.77 g of the glass powder was then dissolved in the acid mixture while stirring at 700 revolutions per minute (rpm) with a TEFLON-coated magnetic stir bar. Some amount of HF in the acid was consumed by reaction with glass. After the glass powder was fully dissolved, the HF concentration was 1.5 M, and the $H_2SO_4$ concentration was 0.9M.

TABLE I

| Glass Composition | | |
|---|---|---|
| Component | Wt % | mol % |
| $SiO_2$ | 61.6 | 69.59 |
| $Al_2O_3$ | 12.8 | 8.52 |
| $Na_2O$ | 0.16 | 0.17 |
| $K_2O$ | 20.2 | 14.55 |
| MgO | 3.81 | 6.42 |
| CaO | 0.46 | 0.56 |
| $SnO_2$ | 0.4 | 0.18 |
| $Fe_2O_3$ | 0.02 | 0.01 |

The three sheets that served as the precipitation-capturing devices were individually placed in Petri dishes, and 30 ml of the acid solution was added to each Petri dish. After 5 hours, the sheets were shaken in the acid solution and then removed from the Petri dishes. The sheets were allowed to sit overnight in a ventilated hood to dry.

Figure 1:
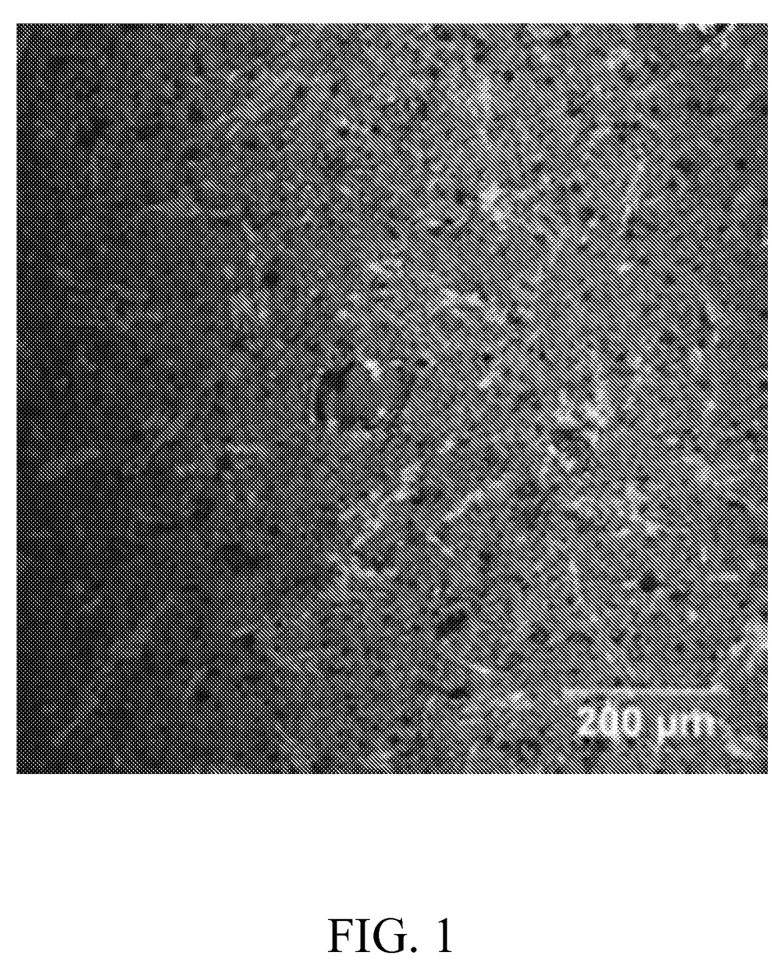
FIG. 1 is a confocal microscope image of a surface of a smooth, non-porous, and non-seeded sheet of VITON in accordance with EXAMPLES 1 and 2.
Figure 2:
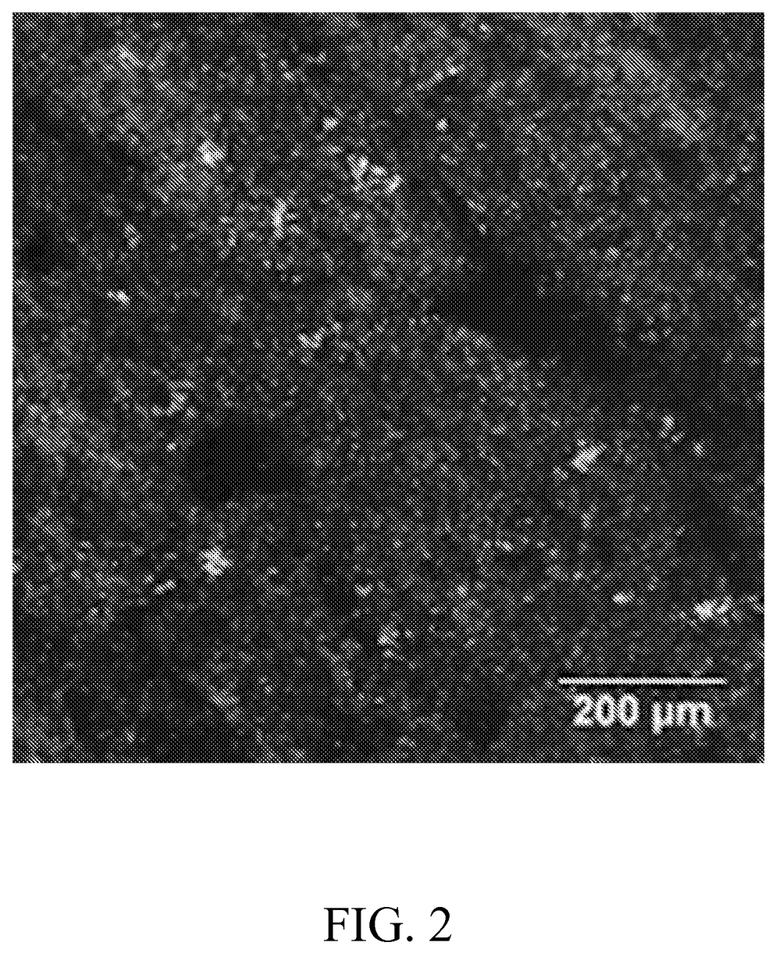
FIG. 2 is a confocal microscope image of a surface of a roughened, non-porous, and non-seeded sheet of VITON in accordance with EXAMPLES 1 and 2.
Figure 3:
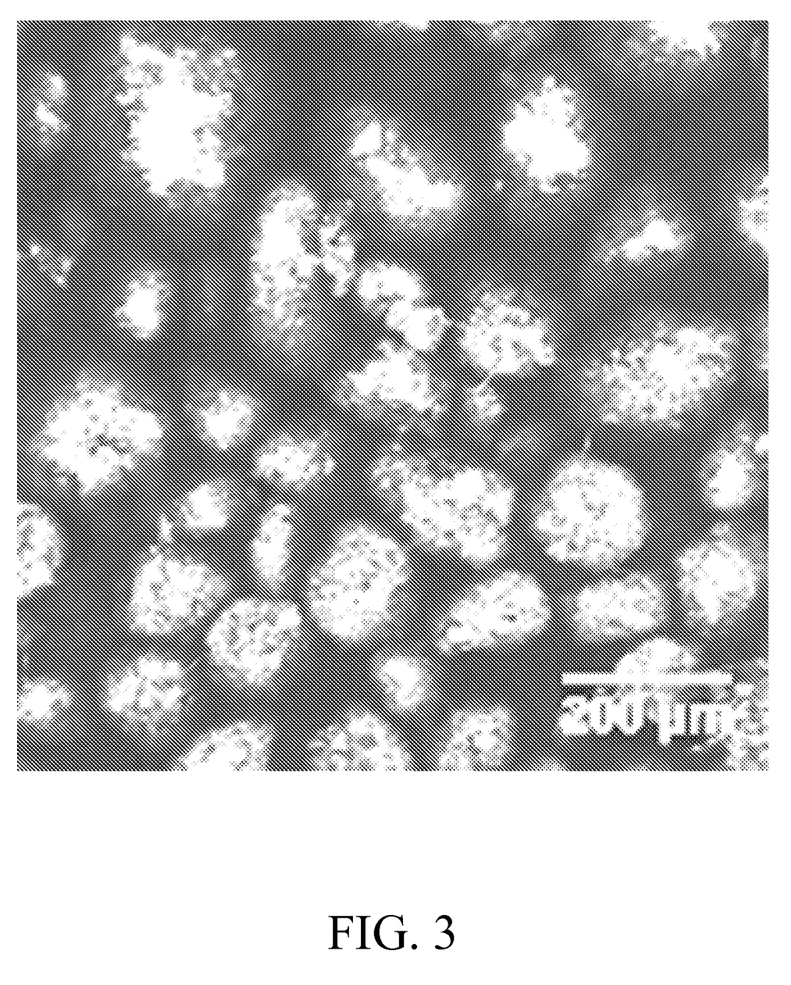
FIG. 3 is a confocal microscope image of a surface of a porous and non-seeded sheet of PTFE in accordance with EXAMPLES 1 and 2.

The surfaces of the dried sheets were analyzed using a confocal microscope. As shown in the confocal microscope image of FIG. 1, very few precipitate particles were observed on the smooth, non-porous sheet of VITON. Similarly, the confocal microscope image of FIG. 2 reveals that very few particles precipitated on the roughened, non-porous sheet of VITON. In contrast, as can be seen in the confocal microscope image of FIG. 3, large precipitate particles were observed on the porous PTFE sheet. These particles had a size of about 50 to about 200 μm, and were aggregates of many small particles or crystallites. From this data, it was concluded that a porous PTFE surface was more favorable for precipitation and crystal growth than a non-porous VITON surface, regardless of surface roughness.

Additionally, the precipitate particles were analyzed by X-ray diffraction. The major phase of the precipitate was identified as potassium silicofluoride ($K_2SiF_6$), which has a cubic structure.

Example 2

Precipitation Study Using Seeded Surfaces

In this example, the same three types of precipitation-capturing devices as in EXAMPLE 1 were studied for efficacy, with the exception that each device was "seeded" with precipitate particles prior to being placed in the acid solution.

The seeding treatment included preparation of a seeding solution and seeding the sample surface. The seeding solution used in this example contained 1.5 M HF, 0.9 M $H_2SO_4$, and 8 g/L of dissolved glass. 155.1 ml deionized water was first mixed with 13.0 ml concentrated HF (29 M) and 8.9 ml concentrated $H_2SO_4$ (18 M). 1.42 g of the same glass powder that was used in EXAMPLE 1 was then added to the acid mixture. After stirring for 5 hours at 700 rpm with a TEFLON-coated magnetic stir bar, the glass powder was completely dissolved. The resulting solution was the seeding solution.

The seeding treatment included soaking each sheet in the seeding solution for 3 hours, followed by drying in a ventilated hood overnight.

The seeded samples were then subjected to the same procedure as in EXAMPLE 1 to determine how well the three sheets captured precipitate.

Figure 4:
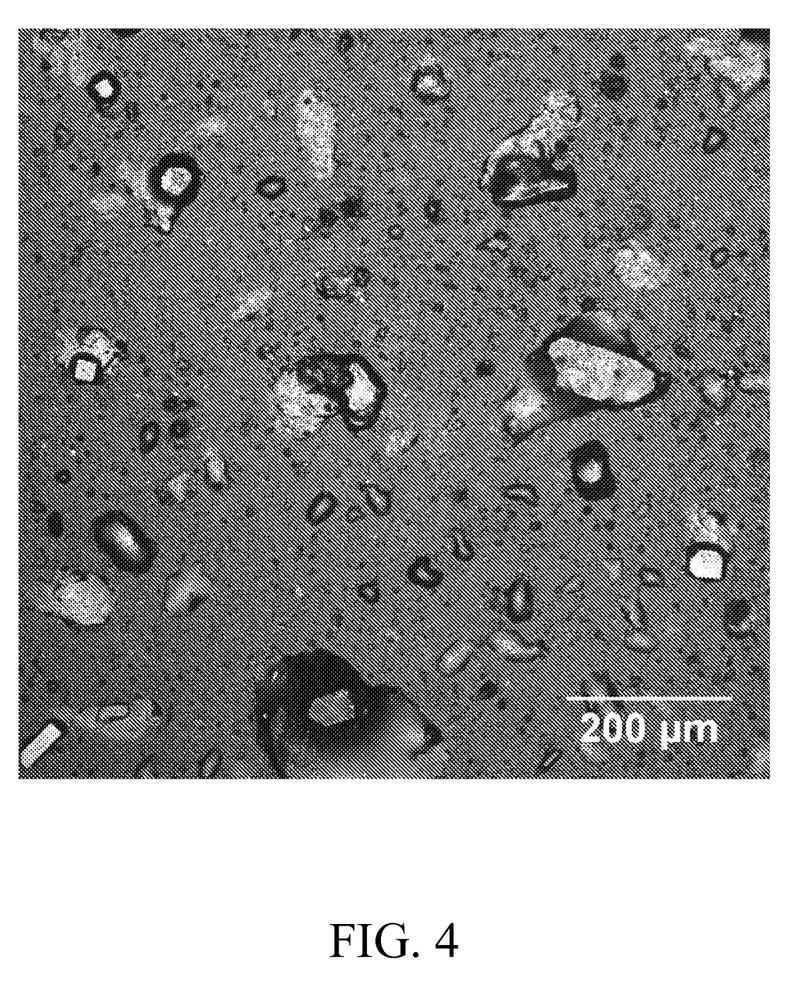
FIG. 4 is a confocal microscope image of a surface of a roughened, non-porous, and seeded sheet of VITON in accordance with EXAMPLE 2.
Figure 5:
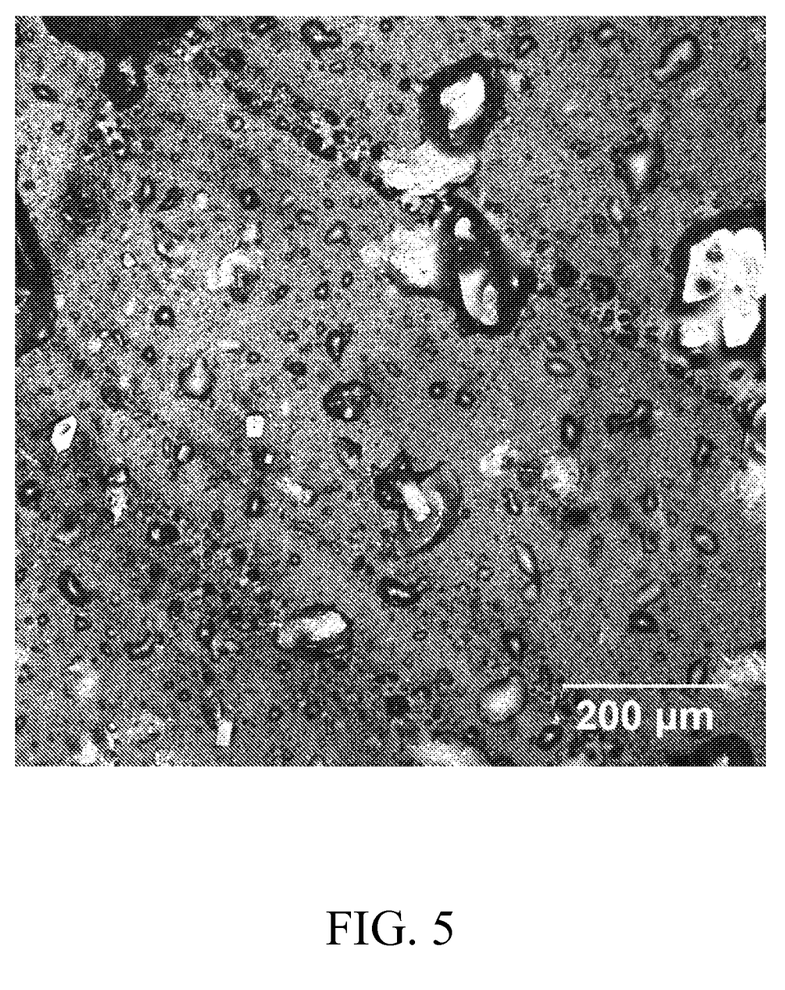
FIG. 5 is a confocal microscope image of a surface of a roughened, non-porous, and seeded sheet of VITON in accordance with EXAMPLE 2.
Figure 6:
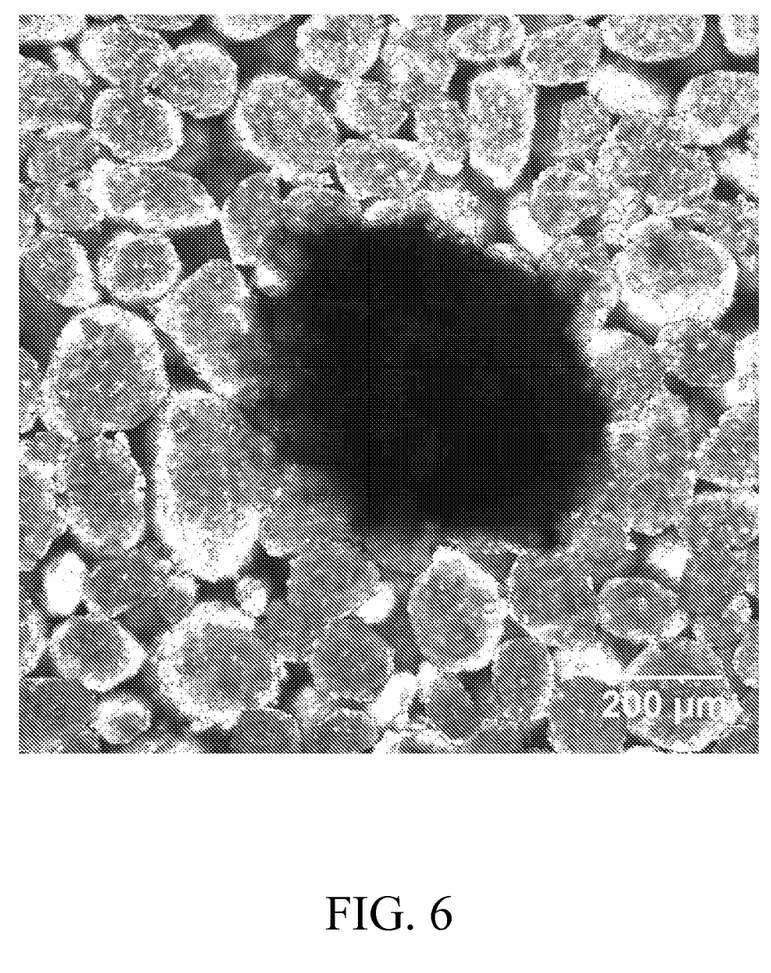
FIG. 6 is a confocal microscope image of a surface of a porous and seeded sheet of PTFE in accordance with EXAMPLE 2.

FIGS. 4 through 6 are confocal microscope images of the three types of samples of this example. Specifically, FIG. 4 corresponds to the seeded, smooth, and non-porous sheet of VITON; FIG. 5 corresponds to the seeded, roughened, and non-porous sheet of VITON; and FIG. 6 corresponds to the seeded, porous PTFE sheet. Comparing FIG. 4 with FIG. 1, FIG. 5 with FIG. 2, and FIG. 6 with FIG. 3, it was clear that particle precipitation was more favorable on seeded surfaces.

It should be noted that the large dark/black spot in the center of the microscope image of FIG. 6 was due to a large particle that was out of focus or that fell off the sheet during imaging.

With respect to the seeded VITON samples, more crystals/particulates were formed on the roughened surface (FIG. 5) than on the smooth surface (FIG. 4).

While the embodiments disclosed herein have been set forth for the purpose of illustration, the foregoing description should not be deemed to be a limitation on the scope of the disclosure or the appended claims. Accordingly, various modifications, adaptations, and alternatives may occur to one skilled in the art without departing from the spirit and scope of the present disclosure or the appended claims.

What is claimed is:

1. A system for treating a glass article, the system comprising:
   an etching vessel;
   an acidic medium disposed in the etching vessel; and
   a precipitation-capturing device disposed in the etching vessel and in fluid communication with the acidic medium;
   wherein the precipitation-capturing device is formed from a material that is not soluble in the acidic medium and is thermally stable to at least 60 degrees Celsius;
   wherein the precipitation-capturing device is configured to permit formation thereon of precipitates of constituent components of the glass article that are dissolved in the acidic medium;
   wherein the precipitation-capturing device is non-porous;
   wherein at least one surface of the precipitation-capturing device is a non-porous surface for nucleating said precipitates of the constituent components of the glass article on the at least one non-porous surface; and
   wherein the precipitation-capturing device is configured to reduce formation of the precipitates on a surface of the etching vessel, the glass article, and any other solid article disposed in the etching vessel relative to an identical system for treating the glass article that lacks the precipitation-capturing device.

2. The system of claim 1, wherein the acidic medium comprises one or more of HF, $H_2SO_4$, $H_2SO_3$, $H_3PO_4$, $H_3PO_2$, $HNO_3$, HCl, HBr, HOAc (acetic acid), citric acid, tartaric acid, ascorbic acid, ethylenediaminetetraacetic acid (EDTA), methanesulfonic acid, or toluenesulfonic acid.

3. The system of claim 1, wherein the acidic medium comprises HF and one or more of HCl, $HNO_3$ or $H_2SO_4$.

4. The system of claim 1, wherein the precipitation-capturing device comprises polyvinyl chloride, polytetrafluoroethylene, polyvinylidene fluoride, polypropylene, natural rubber, synthetic nitrile butadiene rubber, graphitic carbon, a fluoropolymer elastomer, hexafluoropropylene, or perfluoromethylvinylether.

5. The system of claim 1, wherein the precipitation-capturing device is at least partially submerged in the acidic medium.

6. The system of claim 1, further comprising a temperature-increasing mechanism configured to elevate a temperature of the acidic medium, the glass article, the precipitation-capturing device, and/or the etching vessel.

7. A method for treating a glass article, the method comprising:
   providing a system for treating the glass article, the system comprising:
   an etching vessel;
   an acidic medium disposed in the etching vessel; and
   a precipitation-capturing device disposed in the etching vessel and in fluid communication with the acidic medium;
   wherein the precipitation-capturing device is formed from a material that is not soluble in the acid medium and is thermally stable to at least 60 degrees Celsius; wherein the precipitation-capturing device is configured to permit formation thereon of precipitates of constituent components of the glass article that are dissolved in the acidic medium; wherein the precipitation-capturing device is non-porous; wherein at least one surface of the precipitation-capturing device is a non-porous surface for nucleating said precipitates of the constituent components of the glass article on the at least one non-porous surface; and wherein the precipitation-capturing device is configured to reduce formation of the precipitates on a surface of the etching vessel, the glass article, and any other solid article disposed in the etching vessel relative to an identical system for treating the glass article that lacks the precipitation-capturing device;
   contacting the glass article with the acidic medium for a time effective to dissolve a portion of the glass article;
   nucleating precipitates of the constituent components of the glass article on the at least one non-porous surface.

8. The method of claim 7, wherein the portion of the glass article comprises less than about 10 micrometers of a surface layer of the glass article.

9. The method of claim 7, wherein the contacting comprises submerging at least a portion of the glass article in the acidic medium.

10. The method of claim 7, wherein the contacting comprises spraying the acidic medium on at least a portion of the glass article in the etching vessel.

11. The method of claim 7, further comprising elevating a temperature of the acidic medium, the glass article, the precipitation-capturing device, and/or the etching vessel.

12. The method of claim 11, wherein the temperature of the acidic medium is about 40 degrees Celsius to about 60 degrees Celsius.

13. The method of claim 7, further comprising seeding the precipitation-capturing device with a plurality of precipitates of constituent components of the glass article prior to contacting the glass article with the acidic medium.

14. The method of claim 13, wherein seeding the precipitation-capturing device comprises:
    contacting a surface of the precipitation-capturing device with a seeding solution to wet the surface therewith, wherein the seeding solution comprises dissolved glass article constituent components; and
    drying the wetted seeding solution on the surface of the precipitation-capturing device.

15. The method of claim 7, further comprising:
    removing the precipitation-capturing device from the etching vessel after the precipitation-capturing device is saturated with the precipitates of constituent components of the glass article.

16. The method of claim 15, further comprising:
    cleaning the saturated precipitation-capturing device to remove at least a portion of the precipitates of constituent components of the glass article therefrom; and
    inserting the cleaned precipitation-capturing device into the etching vessel.

17. The method of claim 16, further comprising:
    seeding the cleaned precipitation-capturing device with a plurality of precipitates of constituent components of the glass article prior to inserting.

18. The system of claim 1, wherein the non-porous surface for nucleating said precipitates of the constituent components of the glass article is a roughened non-porous surface comprising at least one nucleation site.

* * * * *